United States Patent [19]

Wang et al.

[11] Patent Number: 6,107,132
[45] Date of Patent: Aug. 22, 2000

[54] METHOD OF MANUFACTURING A DRAM CAPACITOR

[75] Inventors: Chuan-Fu Wang, Taipei Hsien; Jason J. S. Jenq, Pingtung; Benjamin Szu-Min Lin, Chiayi, all of Taiwan

[73] Assignee: United Microelectronics Corp., Hsinchu, Taiwan

[21] Appl. No.: 09/207,923

[22] Filed: Dec. 9, 1998

[51] Int. Cl.⁷ .............................................. H01L 21/8234
[52] U.S. Cl. ...................... 438/238; 438/253; 438/396; 437/52
[58] Field of Search ................... 438/238, 253, 438/396; 437/52

[56] References Cited

U.S. PATENT DOCUMENTS

| | | | |
|---|---|---|---|
| 5,429,980 | 7/1995 | Yang et al. | 437/52 |
| 5,728,617 | 3/1998 | Tseng | 438/253 |
| 5,851,876 | 12/1998 | Jenq | 438/253 |

*Primary Examiner*—Amir Zarabian
*Assistant Examiner*—Pho Luu
*Attorney, Agent, or Firm*—Oblon, Spivak, McClelland, Maier & Neustadt, P.C.

[57] ABSTRACT

A method of manufacturing a DRAM capacitor comprises the steps of providing a substrate having a word line, a source/drain region, a bit line and a first insulator layer. A hard mask layer and a second insulator layer are formed on the first insulator layer in sequence. Next, an opening is formed to expose a portion of the first insulator layer by patterning the second insulator layer and the hard mask layer. Thereafter, a spacer is formed on the side wall of the opening and a node contact hole is formed to expose a portion of the source/drain region in the first insulator layer. The second insulator layer is stripped to expose the hard mask layer and a conductive layer is formed over the hard mask layer and fills the node contact hole. A bottom electrode is formed by patterning the conductive layer and a dielectric layer and another conductive layer are formed over the bottom electrode in sequence.

13 Claims, 5 Drawing Sheets

METHOD OF MANUFACTURING A DRAM CAPACITOR

BACKGROUND OF THE INVENTION

1. Field of the Invention

The present invention relates to a method of manufacturing a semiconductor device. More particularly, the present invention relates to a method of manufacturing a DRAM capacitor.

2. Discussion of the Background

Dynamic random access memory chips, or DRAMs are applied broadly in the field of integrated circuits devices, and more importantly, in the electronics industry. DRAMs with higher capacitance are necessary for the development of the industry. As a result, DRAMs with higher density and capacitance are of great interest and are developed by the related industry. Maintaining quality as the size of these devices is reduced is now a task for the industry to overcome.

In digital data storage, the capacitance of the memory is called a "bit" and the unit for data storage in a memory is called a "memory cell". The memory cell is arranged in an array consisting of columns and rows. A set of a column indicator and a row indicator represents a specific address. Memory cells in the same column or the same row are coupled by a common wiring line, which is called a word line. The vertical wiring line related to data transmittance is called a bit line. The current design of DRAM is composed of a transistor which is series-coupled to a capacitor to replace the original memory consisting of three transistors. In this manner, the circuit is simplified and the density of the device can be increased.

For the design of Ultra Large Scale Integration (ULSI) DRAM, the lithography and alignment controlling the contact is increasingly more and more critical as the device size is gradually reduced. Currently, the minimum diameter of the node contact hole is 0.24 $\mu$m. When the photolithography step is performed to define a node contact hole, the node contact hole must align with the source/drain region. The larger the node contact hole is, the less tolerance for the contact hole the source/drain region has. The lower tolerance of the source/drain region for the node contact hole results in the decrease of the alignment accuracy. Accordingly, the node contact is easily electrically coupled to the bit line surrounding the node contact, and this causes device failure.

In order to improve the alignment accuracy, the surface area of the source/drain region is expanded to enhance the allowance tolerance range for the node contact hole. But the expansion of the surface area of the source/drain region lead to the enhancement of the junction capacitance. Moreover, the enhancement of junction capacitance slow down the transportation rate of the transistor.

FIGS. 1A through 1B are schematic, cross-sectional views of the x-axis of a DRAM capacitor undergoing manufacturer by a conventional process.

First, as shown in FIG. 1A, a substrate 100 having a word line 104 and a source/drain region 102 is provided. An insulator layer 110 is formed to cover the substrate, and then a bit line 106 is formed by patterning the insulator layer 110. Next, an insulator layer 108 is formed to cover the substrate. For the sake of simplicity, an insulator layer 108b is thus formed and comprises the insulator layer 110 and 108. A hard mask layer 112 such as a silicon nitride layer is formed on the insulator layer 108b after the insulator layer 108b has been planarized.

Referring to FIG. 1B, the hard mask layer 112 and the insulator layer 108b are patterned to form a node contact hole 114 until the node contact hole exposes a portion of the source/drain region 102. The insulator layer 108b and the hard mask layer 112 are converted into an insulator layer 108a and a hard mask layer 112a.

FIG. 2 is a schematic, cross-sectional view of the y-axis of the FIG. 1B. In order to increase the integration of the ICs, the distance between the bit line and the word line is reduced. The minimum diameter of the node contact hole manufactured by using conventional techniques is 0.24 $\mu$m, so that the allowance tolerance range of the source/drain region for the node contact hole is reduced. Therefore, the alignment accuracy is decreased. Due to the decreased alignment accuracy, the node contact subsequently formed easily becomes electrically coupled to the bit line 106 surrounding the node contact. Consequently device failure is caused because the node contact is electrically coupled to the bit line.

SUMMARY OF THE INVENTION

Therefore one aspect of the present invention is to provide a method of manufacturing a DRAM capacitor. The method can overcome the problems due to the low alignment accuracy in conventional techniques.

Another aspect of the present invention is to provide a method of manufacturing a DRAM capacitor. The surface of the capacitor is increased by using the method of the present invention, so that the capacity of the capacitor is increased.

To achieve these and other advantages and in accordance with the purpose of the invention, as embodied and broadly described herein, the invention provides a method of manufacturing a DRAM capacitor. The method comprises the steps of providing a substrate having a word line, a source/drain region, a bit line and a first insulator layer. A hard mask layer and a second insulator layer are formed on the first insulator layer in sequence. Next, an opening is formed to expose a portion of the first insulator layer by patterning the second insulator layer and the hard mask layer.

Thereafter, a spacer is formed on the sidewall of the opening and a node contact hole is formed to expose a portion of the source/drain region in the first insulator layer. The spacer is utilized to reduce the size of the node contact hole and improve the alignment accuracy. Next, the second insulator layer is stripped to expose the hard mask layer and a conductive layer is formed over the hard mask layer and fills the node contact hole. Since the spacer protuberates from the surface of the hard mask, the surface area of the conductive layer is increased and the capacity of the capacitor can be enhanced. A bottom electrode is formed by patterning the conductive layer and a dielectric layer. Another conductive layer is formed over the bottom electrode in sequence.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
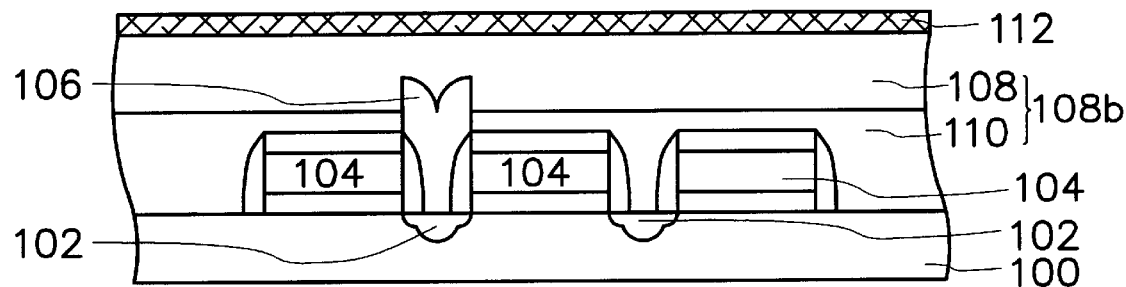
FIGS. 1A through 1B are schematic, cross-sectional views of the x-axis of the conventional process for manufacturing a DRAM capacitor.
Figure 1B:
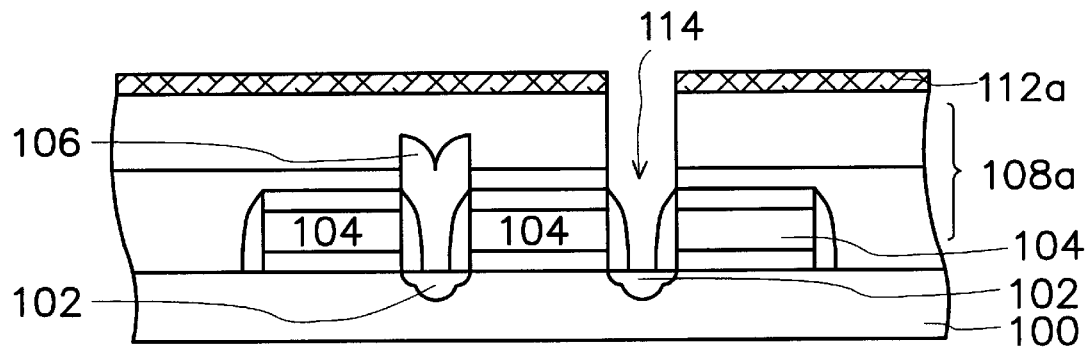
Figure 2:
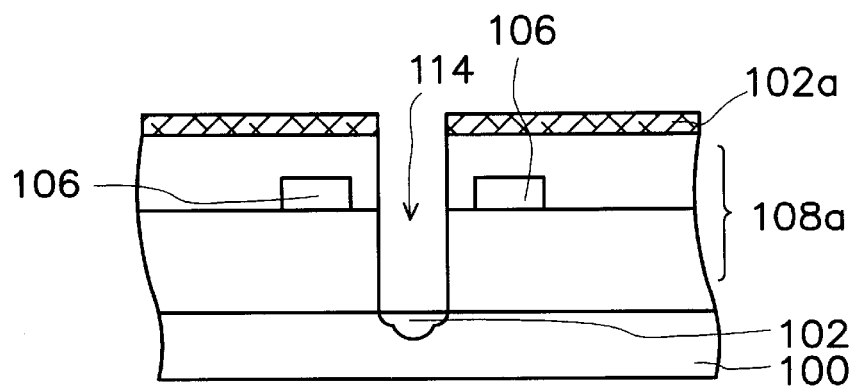
FIG. 2 is schematic, cross-sectional view of the y-axis of the FIG. 1B.

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3G are schematic, cross-sectional views of a DRAM capacitor at various stages during the manufacturing process in a preferred embodiment according to the invention.

Figure 3A:
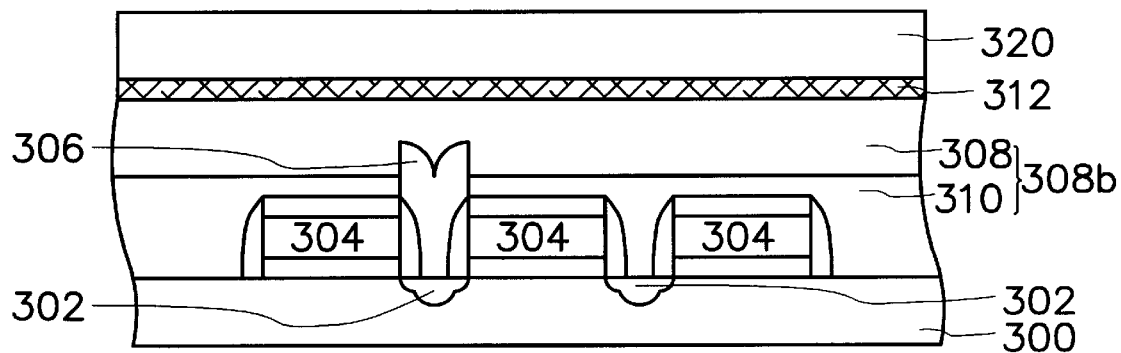
FIGS. 3A through 3G are schematic, cross-sectional views of the process for manufacturing a DRAM capacitor in a preferred embodiment according to the invention.

First, as shown in FIG. 3A, a substrate 300 having a word line 304 and a source/drain region 302 is provided. An insulator layer 310 is formed to cover the substrate 300, and a bit line 306 is formed by patterning the insulator layer 310. An insulator layer 308 is formed to cover the substrate 300. For the sake of simplicity, an insulator layer 308b is thus formed which comprises the insulator layer 310 and 308. A hard mask layer 312 such as a silicon nitride layer is formed on the insulator layer 308b after the insulator layer 308b has been planarized. The method of planarizing the insulator layer 308b includes chemical-mechanical polishing or etching back. The method of forming the hard mask layer 312 includes low-pressure chemical vapor deposition. Preferably, the low-pressure chemical vapor deposition is conducted at a temperature of about 650–800 centigrade and a pressure of about 0.1–1 torr. An insulator layer 320 such as a silicon oxide layer is formed on the hard mask layer 312. The method of forming the insulator layer 320 includes chemical vapor deposition.

Figure 3B:
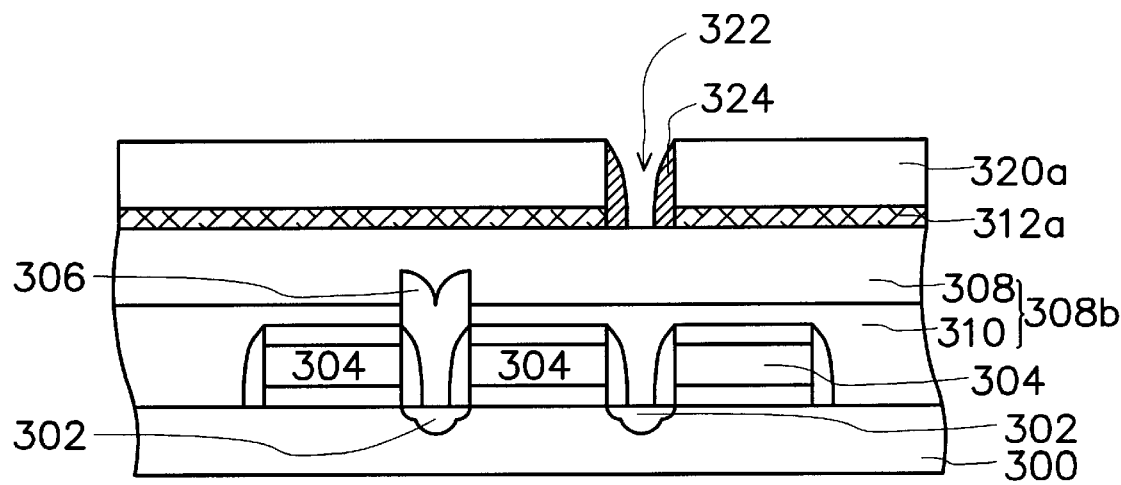

Referring to FIG. 3B, the insulator layer 320 and the hard mask layer 312 are patterned to form an opening 322, which is aligned over a portion of the source/drain region 302 and to expose a portion of the insulator layer 308b. The insulator layer 320 and the hard mask layer 312 are converted into a insulator layer 320a and a hard mask layer 312a. A spacer 324 is formed on the sidewall of the opening 322. The spacer 324 can be made from silicon nitride or other insulator material. For example, the method of forming the spacer 324 comprises the steps of conformally depositing an insulator material over the substrate 300, and then performing anisotropic etching to form the spacer 324. The method of forming a conformal insulator material over the substrate includes low pressure chemical vapor deposition or atmospheric pressure chemical deposition. The thickness and dimension of the spacer 324 can be controlled by adjusting the anisotropic etching process. The spacer 324 is used as an etching mask to confine and reduce the size of the node contact hole and, thus, to increase the allowance tolerance range of the source/drain region for the node contact hole. Thus, the alignment accuracy can be improved.

Figure 3C:
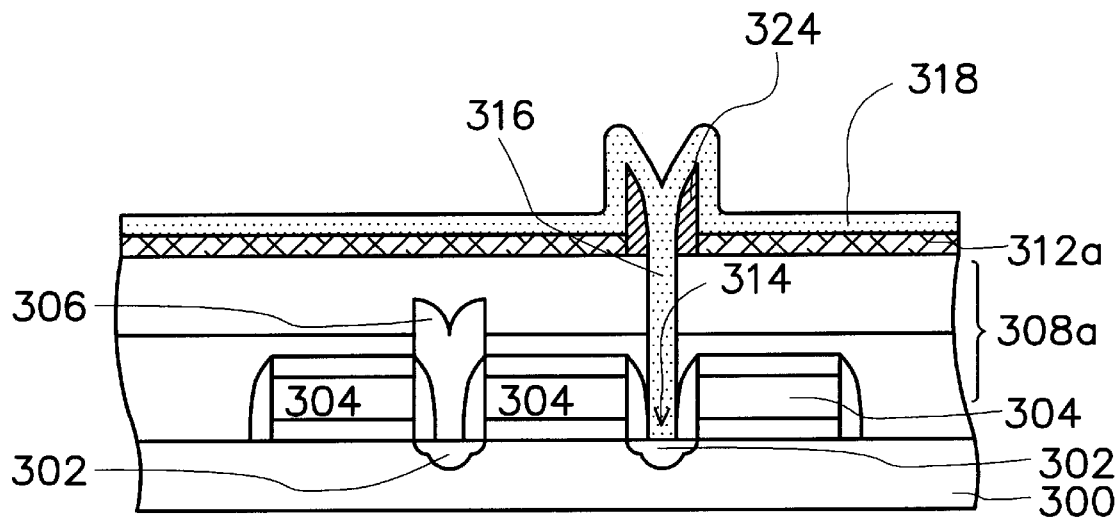

Next, as shown in FIG. 3C, an etching step is utilized to form a node contact hole 314 through the insulator layer 308b exposed by the hard mask 312a and the spacer 324 until the node contact hole 314 exposes a portion of the source/drain region 302. The insulator layer 320a is stripped to expose the surface of the hard mask layer 312a. A conductive layer 318 is formed on the hard mask 312a and fills the node contact hole 314. The conductive layer 318 can be made from polysilicon, for example.

Figure 3D:
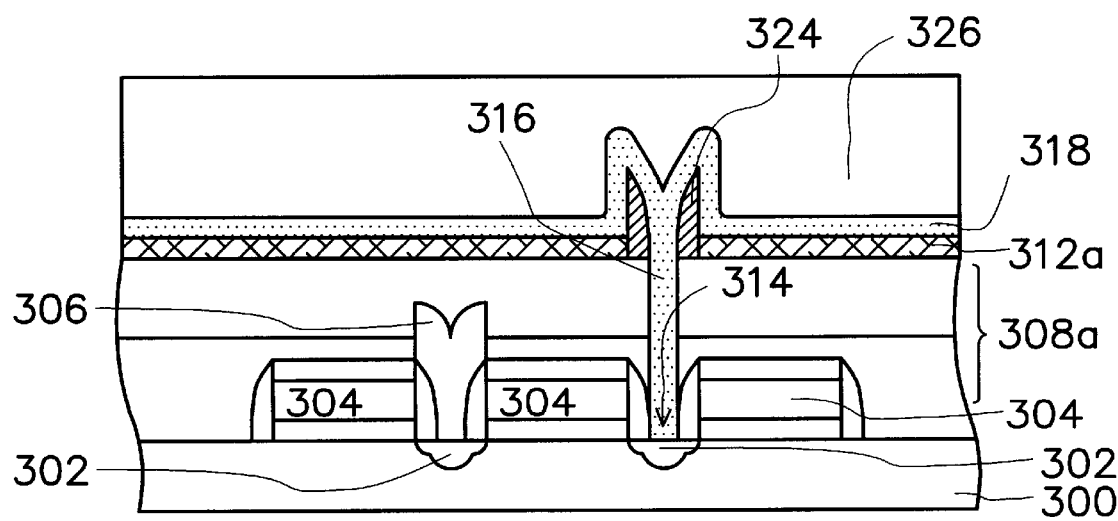

Referring to FIG. 3D, an insulator layer 326 is formed on the conductive layer 318. The insulator layer 326 can be made from borophosphosilicate glass, phosphosilicate glass or silicon oxide, for example. The method of forming the insulator layer 326 includes chemical vapor deposition. A planarizing step such as chemical-mechanical polishing or etching back is utilized to planarize the insulator layer 326.

Figure 3E:
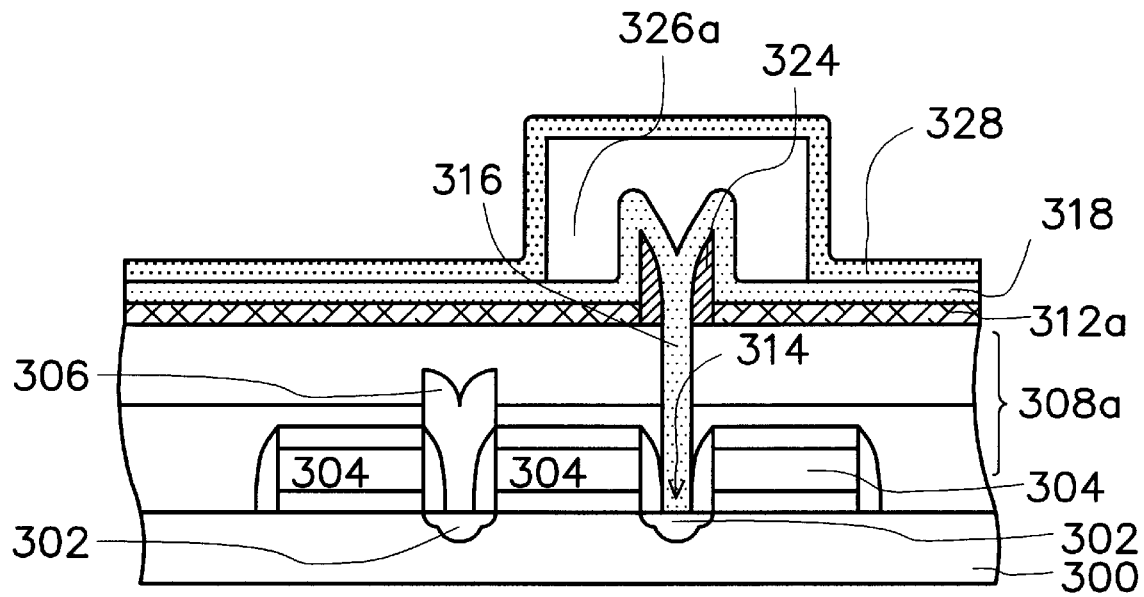
Figure 3F:
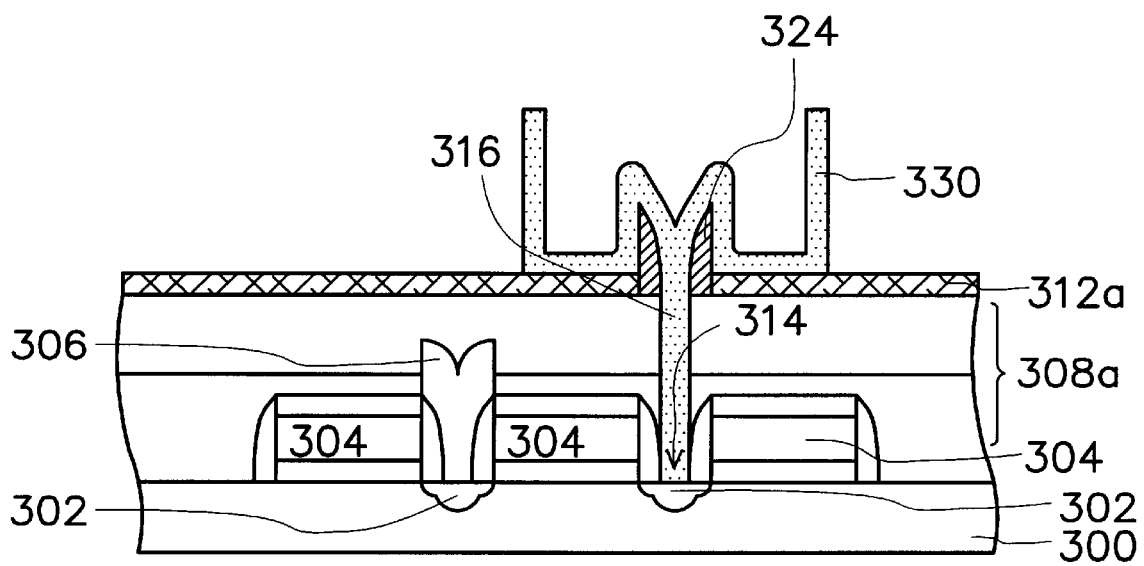

Next, as shown in FIG. 3E, the insulator layer 326 is patterned to form an insulator layer 326a. The insulator layer 326a covers a portion of the conductive layer 318 above and around the spacer 324. The rest of the conductive layer 318 is exposed. A conductive layer 328 such as a polysilicon layer is formed over the substrate 300. The conductive layer 328 covers the exposed portion of conductive layer 318 and the upper surface and the sidewall of the insulator layer 326a. An etching step is utilized to remove the portion of the conductive layer 328 covering the exposed portion of conductive layer 318 and the upper surface of the insulator layer 326a. The portion of the conductive layer 328 covering the sidewall of the insulator layer 326a remains. The exposed portion of the conductive layer 318 is also removed by the etching step. The insulator layer 326a is then stripped to expose the remaining portion of the conductive layer 318. The method of stripping the insulator layer 326a includes wet etching, and the preferred method is to use the hydrofluoric acid as the etchant. Accordingly, the residual conductive layer 328 and 318 can be integrated into a bottom electrode 330 as shown in FIG. 3F. The bottom electrode 330 provides the advantage of enhanced surface area. Since the spacer 324 protuberates from the surface of the hard mask 312a, the surface area of the conductive layer 318 is increased. Furthermore, the surface area of the bottom electrode 330 is larger than that of the conventional bottom electrode, so that the capacity of the capacitor is enhanced.

Figure 3G:
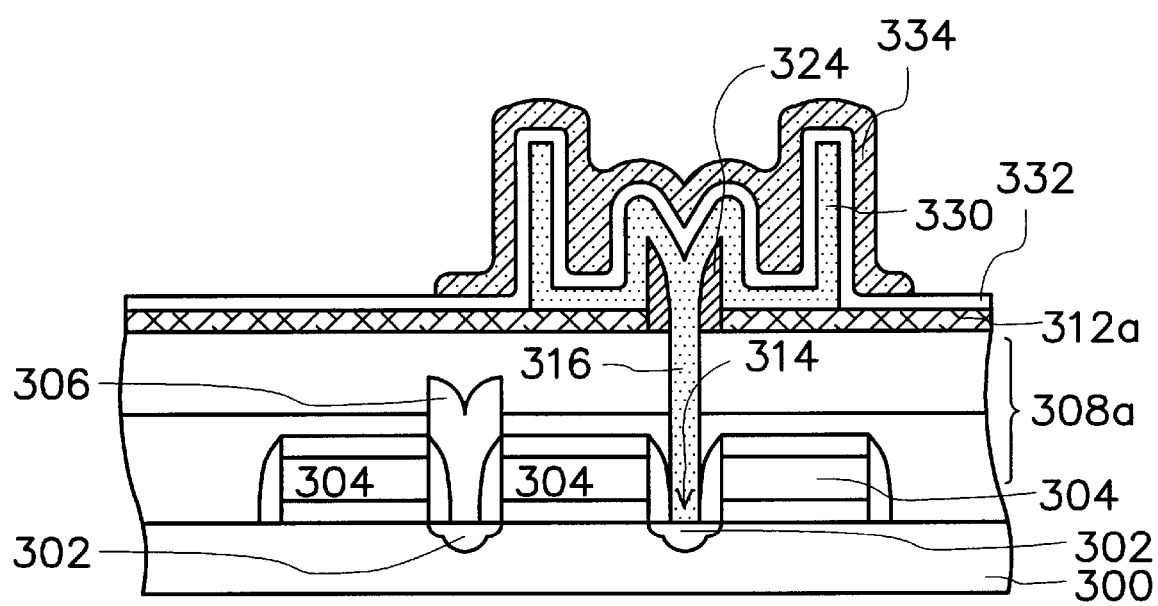

Referring to FIG. 3G, a dielectric layer 332 and a conductive layer 334 are formed on the bottom electrode 330 and the hard mask 312a in sequence. The conductive layer 334 is used as an upper electrode of the capacitor, and it can be made from polysilicon, for example.

In the embodiment according to the present invention, the insulator layer 320 is formed on the hard mask 312 before the node contact hole is formed. The opening 322, which corresponds to the location of the source/drain region 302, is formed to expose a portion of the insulator layer 308b. The spacer 324 is formed on the side wall of the opening 322. Because the spacer 324 is used as an etching mask to reduce the size of the node contact hole and increase the tolerance of the source/drain region for the node contact hole, the alignment accuracy can be improved. Additionally, the spacer 324 protuberates from the surface of the hard mask 312a, thus the surface area of the conductive layer 318 covering the spacer 324 is increased. Moreover, the surface area of the bottom electrode 330 is increased, so that the capacity of the capacitor is enhanced.

The present invention has the following advantages:

1. Before the node contact hole is formed, the spacer 324 is formed on the side wall of the opening 322. Since the spacer 324 reduces the size of the node contact hole and increases the allowance tolerance of the source/drain region for the node contact hole, the alignment accuracy can be improved.

2. The spacer 324 protuberates from the surface of the hard mask 312a, thus the surface area of the conductive layer 318 is increased. Moreover, the surface area of the bottom electrode 330 is increased, so that the capacity of the capacitor is enhanced.

3. The present invention and the conventional process techniques are compatible; thus the present invention is suitable for manufacturers to utilize.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a DRAM capacitor suitable for a substrate having a word line, a source/drain region, a bit line and a first insulator layer covering the word line, the source/drain region and the bit line, the method comprising the steps of:

forming a hard mask layer on the first insulator layer; forming a second insulator layer on the hard mask layer; patterning the second insulator layer and the hard mask layer to form an opening which is aligned to the source/drain region and exposes a portion of the first insulator layer surface;

forming a spacer on sidewall of the opening; forming a node contact hole in the first insulator layer exposed by the spacer and the opening, the node contact hole exposing a portion of the source/drain region;

stripping the second insulator layer to expose the hard mask layer;

forming a first conductive layer over the hard mask layer, wherein the first conductive layer fills the node contact hole and covers the spacer;

forming a third insulator layer on the first conductive layer;

planarizing the third insulator layer;

patterning the third insulator layer;

forming a second conductive layer over the substrate;

forming a bottom electrode of the capacitor by stripping away a portion of the second conductive layer, the first conductive layer and the third insulator layer; and forming a dielectric layer and a third conductive layer over the bottom electrode in sequence.

2. The method of claim 1, wherein the spacer includes silicon nitride.

3. The method of claim 1, wherein the hard mask layer includes silicon nitride.

4. The method of claim 1, wherein the first insulator layer includes borophosphosilicate glass.

5. The method of claim 1, wherein the first insulator layer includes phosphosilicate glass.

6. The method of claim 1, wherein the first insulator layer includes silicon oxide.

7. The method of claim 1, wherein the second insulator layer includes silicon oxide.

8. The method of claim 1, wherein the first conductive layer includes polysilicon.

9. The method of claim 1, wherein the second conductive layer includes polysilicon.

10. The method of claim 1, wherein the step of planarizing the third insulator layer includes chemical-mechanical polishing.

11. The method of claim 1, wherein the step of planarizing the third insulator layer includes etching back.

12. The method of claim 1, wherein the step of stripping the third insulator layer includes wet etching.

13. The method of claim 1, wherein the third conductive layer includes polysilicon.

* * * * *